(12) United States Patent
Bae et al.

(10) Patent No.: US 12,371,340 B2
(45) Date of Patent: Jul. 29, 2025

(54) POWDER FOR GROWING GALLIUM OXIDE SINGLE CRYSTAL AND METHOD OF MANUFACTURING THE SAME

(71) Applicant: KOREA INSTITUTE OF CERAMIC ENGINEERING AND TECHNOLOGY, Gyeongsangnam-do (KR)

(72) Inventors: Si Young Bae, Jinju-si (KR); Seong Min Jeong, Suwon-si (KR); Yun Ji Shin, Jinju-si (KR); Myung Hyun Lee, Hwaseong-si (KR)

(73) Assignee: KOREA INSTITUTE OF CERAMIC ENGINEERING AND TECHNOLOGY, Gyeongsangnam-do (KR)

( * ) Notice: Subject to any disclaimer, the term of this patent is extended or adjusted under 35 U.S.C. 154(b) by 0 days.

(21) Appl. No.: 18/508,127

(22) Filed: Nov. 13, 2023

(65) Prior Publication Data

US 2024/0158254 A1    May 16, 2024

(30) Foreign Application Priority Data

Nov. 14, 2022    (KR) .................. 10-2022-0151628

(51) Int. Cl.
| | |
|---|---|
| C01G 15/00 | (2006.01) |
| C30B 35/00 | (2006.01) |
| C30B 15/34 | (2006.01) |
| C30B 29/16 | (2006.01) |

(52) U.S. Cl.
CPC ............ *C01G 15/00* (2013.01); *C30B 35/007* (2013.01); *C01P 2004/03* (2013.01); *C01P 2004/54* (2013.01); *C01P 2004/60* (2013.01); *C01P 2006/11* (2013.01); *C01P 2006/12* (2013.01); *C30B 15/34* (2013.01); *C30B 29/16* (2013.01)

(58) Field of Classification Search
CPC ............................ C01P 2006/12; C01G 15/00
See application file for complete search history.

(56) References Cited

U.S. PATENT DOCUMENTS

2011/0240935 A1*  10/2011  Yano ................... H01L 29/7869
                                                                  264/681

FOREIGN PATENT DOCUMENTS

| CN | 109279580 A | 1/2019 |
|---|---|---|
| CN | 111592034 A | 8/2020 |
| JP | 11322335 A * | 11/1999 |
| JP | 3987935 B2 | 10/2007 |
| JP | 4649536 B1 | 3/2011 |
| JP | 2011-153054 A | 8/2011 |

(Continued)

OTHER PUBLICATIONS

Machine translation JP2011-213507 (Year: 2024).*
Machine translation of JP 2014084270 (Year: 2024).*
Machine translation JP-11322335-A (Year: 2025).*

*Primary Examiner* — Alexandre F Ferre
(74) *Attorney, Agent, or Firm* — Studebaker Brackett PLLC (57) ABSTRACT

The present invention relates to a powder for growing a gallium oxide single crystal and a method of manufacturing the same, and the powder for growing a gallium oxide single crystal according to an embodiment of the present invention is made of gallium oxide and has a bulk density of 0.7 g/cm³ or more and 1.0 g/cm³ or less.

8 Claims, 4 Drawing Sheets (56) References Cited

FOREIGN PATENT DOCUMENTS

| | | | | |
|---|---|---|---|---|
| JP | 2011213507 | A | * | 10/2011 |
| JP | 2014084270 | A | * | 5/2014 |
| JP | 2016-185893 | A | | 10/2016 |
| TW | I476157 | B | | 3/2015 |

* cited by examiner

COMPARATIVE EXAMPLE

EMBODIMENT 1

FIG. 3

EMBODIMENT 2-1

EMBODIMENT 2-2

EMBODIMENT 2-3

EMBODIMENT 2-4

EMBODIMENT 2-8

FIG. 4

POWDER FOR GROWING GALLIUM OXIDE SINGLE CRYSTAL AND METHOD OF MANUFACTURING THE SAME

CROSS-REFERENCE TO RELATED APPLICATION

This application claims priority to and the benefit of Japanese Patent Application No. 10-2022-0151628, filed on Nov. 14, 2022, the disclosure of which is incorporated herein by reference in its entirety.

BACKGROUND

1. Field of the Invention

The present invention relates to a powder for growing a gallium oxide single crystal and a method of manufacturing the same, and more particularly, to a powder for growing a gallium oxide single crystal with maximized conversion efficiency from a raw material to a single crystal and a method of manufacturing the same.

2. Discussion of Related Art

Gallium oxide ($Ga_2O_3$) has a wide band gap and a high breakdown voltage, so it has been attracting attention as a material for next-generation power devices. In particular, demand for power devices is increasing due to the recent expansion of electric vehicles, and as high performance is required, demand for gallium oxide is expected to increase rapidly.

A gallium oxide power device is formed on a gallium oxide single crystal substrate, and various single crystal growth technologies for manufacturing the gallium oxide single crystal substrate have been studied.

An Edge-defined Film-fed Growth (EFG) method among the methods for growing a gallium oxide single crystal is a method of growing a gallium oxide single crystal by filling gallium oxide powder into a crucible, melting it, and then raising the molten gallium oxide solution through a slit to grow a gallium oxide single crystal. The EFG method facilitates control of single crystal defects, and has a relatively fast growth rate, so it has an advantage of efficiently growing a high-quality sheet-shaped single crystal.

In order to grow a large-size gallium oxide single crystal, it is important to form as much molten gallium oxide solution as possible in the crucible. However, since the volume of the crucible is limited, the amount of gallium oxide powder that can be filled into the crucible is limited, and thus, the amount of gallium oxide single crystal grown from the molten solution by the filled gallium oxide powder is also limited.

In particular, since gallium oxide melts at a high temperature of 1,800° C. or higher, an iridium crucible is used due to its excellent heat resistance and fire resistance, but since iridium is an expensive material, there is a limit to increasing the volume of the iridium crucible.

Meanwhile, even when a large amount of powder for growing a gallium oxide single crystal is filled into the crucible, all of the raw material may not be converted into a single crystal due to various reasons.

Accordingly, there is a need to develop a technology that can fill as much powder for growing a gallium oxide single crystal as possible into a limited crucible and at the same time, can successfully grow as much single crystal from a powder for growing a gallium oxide single crystal as possible.

Meanwhile, the above-mentioned background technology is technical information that the inventor possessed for deriving the present invention or acquired in the process of deriving the present invention, and cannot necessarily be said to be known technology disclosed to the general public before the application for the present invention.

SUMMARY OF THE INVENTION

The present invention is directed to providing a powder for growing a gallium oxide single crystal with a maximized raw material-to-crystal conversion rate and a method of manufacturing the same.

As a technical means for achieving the above-mentioned technical problem, according to an aspect of the present invention, there is provided a powder for growing a gallium oxide single crystal, which is made of gallium oxide, and has a bulk density of 0.7 g/cm$^3$ or more and 1.0 g/cm$^3$ or less.

According to another aspect of the present invention, the powder for growing a gallium oxide single crystal may have a BET-specific surface area of 1.5 m$^2$/g or more and 4.0 m$^2$/g or less.

According to another aspect of the present invention, the powder for growing a gallium oxide single crystal may be made of gallium oxide particles having a D50 particle diameter of 20 μm or less.

According to another aspect of the present invention, an aspect ratio of the gallium oxide particles may be 1 to 1.5.

According to another aspect of the present invention, the gallium oxide particles may be gallium oxide.

As a technical means for achieving the above-mentioned technical problem, according to another aspect of the present invention, there is provided a method of manufacturing a powder for growing a gallium oxide single crystal, the method including a vaporization step of heating and vaporizing gallium, an oxidation step of oxidizing the vaporized gallium, a crystallization step of cooling and crystallizing the oxidized gallium oxide, a collection step of collecting the crystallized gallium oxide to obtain a gallium oxide powder, and a densification step of making a bulk density of the collected gallium oxide powder be 0.7 g/cm$^3$ or more and 1.0 g/cm$^3$ or less.

According to another aspect of the present invention, the densification step may include a heat treatment step of heat-treating the gallium oxide powder at a temperature of 1,200° C. to 1,300° C.

According to another aspect of the present invention, the heat treatment step may be performed for 5 hours or more.

According to another aspect of the present invention, the powder for growing a gallium oxide single crystal may have a BET-specific surface area of 1.5 m$^2$/g or more and 4.0 m$^2$/g or less.

The powder for growing a gallium oxide single crystal may be made of gallium oxide particles having a D50 particle diameter of 20 μm or less.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Exemplary embodiments of the present invention will be described in detail below with reference to the accompanying drawings so that those skilled in the art can easily carry out the present invention. However, the present invention may be implemented in many different forms, and is not limited to the exemplary embodiments described herein. In order to clearly describe the present invention in the drawings, parts not related to the description are omitted, and similar parts are given similar reference numerals throughout the specification.

Throughout the specification, when a part is said to be "connected" to another part, this includes cases of not only "being directly connected" but also "being indirectly connected" with another member or element therebetween. In addition, when a part "includes" a certain component, this means that it may further include other components rather than excluding other components, unless specifically stated otherwise.

The present invention will be described in detail below with reference to the attached drawings.

A powder for growing a gallium oxide single crystal according to an embodiment of the present invention is a raw material for manufacturing a gallium oxide single crystal ingot or substrate, and consists of gallium oxide particles.

Gallium oxide particles may consist of an alpha($\alpha$) phase, a beta($\beta$) phase, a gamma($\gamma$) phase, a delta($\delta$) phase, or an epsilon($\epsilon$) phase, preferably, the beta phase.

The gallium oxide particles have an aspect ratio of 1 to 10, preferably, an aspect ratio of 1 to 1.5.

Since the powder for growing a gallium oxide single crystal according to an embodiment of the present invention consists of gallium oxide particles with a low aspect ratio of 1 to 1.5, it is formed in a spherical shape, and may have low cohesiveness.

The powder for growing a gallium oxide single crystal according to an embodiment of the present invention may consist of fine particles. Specifically, it may consist of fine particles with a D50 particle diameter of 20 μm or less.

Here, "Dn" particle diameter means a particle diameter at an n % point of an area cumulative distribution according to a diameter of particles. For example, D50 is a particle diameter at 50% of the area cumulative distribution according to the diameter of the particles, and is referred to as a median particle diameter. The above-mentioned particle diameters may be measured using a laser diffraction method. Specifically, a powder to be measured is dispersed in a dispersion medium and then introduced into a commercially available laser diffraction particle size measuring device, and a difference in diffraction patterns according to a particle size when the particles pass through a laser beam is measured to calculate a particle size distribution.

The powder for growing a gallium oxide single crystal according to an embodiment of the present invention has a predetermined bulk density or BET-specific surface area.

Specifically, the powder for growing a gallium oxide single crystal according to an embodiment of the present invention has a bulk density of 0.7 $g/cm^3$ or more and 1.0 $g/cm^3$ or less.

In addition, the powder for growing a gallium oxide single crystal according to an embodiment of the present invention has a BET-specific surface area of 1.5 $m^2/g$ or more and 4.0 $m^2/g$ or less.

Since the powder for growing a gallium oxide single crystal according to an embodiment of the present invention has a bulk density or BET-specific surface area in the above-described range, it may have an excellent raw material-to-crystal conversion rate when growing a gallium oxide single crystal, and may grow a large amount of gallium oxide single crystal compared to an amount thereof filled in the crucible. A detailed description thereof will be provided later.

Hereinafter, a method of manufacturing a powder for growing a gallium oxide single crystal according to an embodiment of the present invention will be described with reference to FIG. 1.

Figure 1:
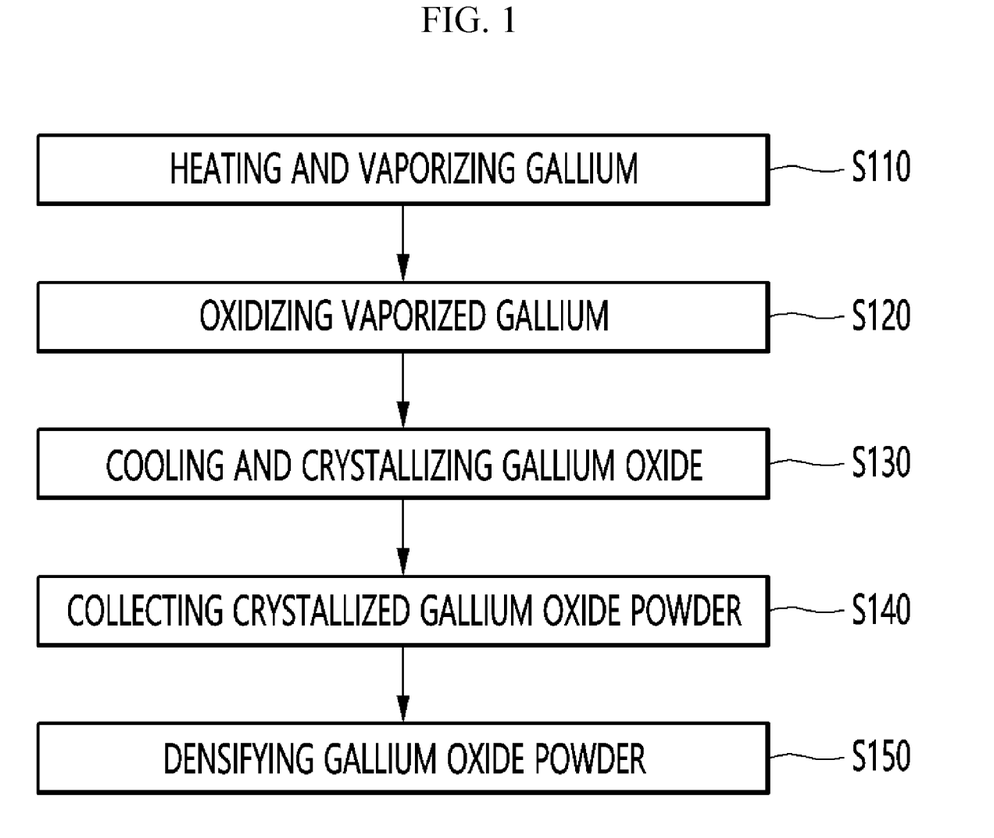
FIG. 1 is a flowchart illustrating a method of manufacturing a powder for growing a gallium oxide single crystal according to an embodiment of the present invention.

FIG. 1 is a flowchart illustrating a method of manufacturing a powder for growing a gallium oxide single crystal according to an embodiment of the present invention.

Referring to FIG. 1, the powder for growing a gallium oxide single crystal according to an embodiment of the present invention is manufactured using thermal vaporized synthesis.

Specifically, gallium is heated and vaporized (S110).

First, gallium in a solid state is provided in a reactor. In this case, gallium metal may be provided in a sheet form or granular form.

Next, the reactor is heated such that the solid gallium is vaporized. For example, the reactor may be heated to a temperature of 1,000° C. to 1,600° C. Within the above-mentioned range, gallium in a solid state is vaporized, and vaporized gallium droplets may float in the reactor.

Thereafter, the vaporized gallium is oxidized (S120).

Specifically, oxygen ($O_2$) for oxidizing the vaporized gallium is supplied into the reactor. Oxygen may be supplied at a flow rate of 0.5 msec to 70 msec. When oxygen is supplied at the above-described flow rate, the vaporized gallium reacts with oxygen and is oxidized, and thus, gallium oxide may be formed.

Thereafter, the oxidized gallium oxide is cooled and crystallized (S130).

Cooling of gallium oxide may be performed in a transfer pipe connected to the reactor. For example, as oxygen flows into the reactor, pressure within the reactor increases and while compressed gas flows into the transfer pipe with a relatively low pressure, gallium oxide may also flow into the transfer pipe.

Gallium oxide may be rapidly cooled in the transfer pipe using a natural cooling method. As gallium oxide is cooled rapidly, rapid crystallization occurs, and it may be crystallized in a form of spherical particles with an aspect ratio of 1 to 1.5.

Thereafter, the crystallized gallium oxide is collected to obtain a gallium oxide powder (S140).

While moving through the transfer pipe, the crystallized gallium oxide particles may be accumulated in a collection portion connected to the transfer pipe and obtained in a powder form. In this case, the collection portion may be maintained at low pressure such that the gallium oxide particles can be collected in the collection portion.

The gallium oxide particles obtained from the collection portion may consist of fine particles of 200 nm or less. For example, a D50 particle diameter of the gallium oxide particles may be 100 to 150 nm.

Thereafter, the obtained gallium oxide powder is densified to have a bulk density of 0.7 g/cm$^3$ or more and 1.0 g/cm$^3$ or less (S150).

A densification process may refer to a step of adjusting the bulk density or BET-specific surface area of gallium oxide such that the obtained gallium oxide powder has an excellent raw material-to-crystal conversion rate.

Specifically, by heat-treating the obtained gallium oxide powder, the bulk density of the gallium oxide powder may be processed to be 0.7 g/cm$^3$ or more and 1.0 g/cm$^3$ or less.

The above-described heat treatment may be performed by filling the gallium oxide powder in a crucible made of a material with high heat resistance and high fire resistance and then heating it. In this case, the crucible may be a crucible made of alumina, without being limited thereto, and is not particularly limited as long as it is made of a material with high heat resistance and high fire resistance.

The heat treatment may be performed at a temperature of 1,200° C. to 1,300° C., and may be performed for 5 hours or more including heating time.

When heat treatment is performed at a temperature below 1,200° C., the bulk density may be lower than 0.7 g/cm$^3$, and when heat treatment is performed at a temperature above 1,300° C., the bulk density may exceed 1.0 g/cm$^3$. Meanwhile, when the bulk density is lower than 0.7 g/cm$^3$ or exceeds 1.0 g/cm$^3$, the raw material-to-crystal conversion rate for growing a gallium oxide single crystal from the gallium oxide powder may be reduced. A detailed description thereof will be provided later.

Meanwhile, the above-described heat treatment may be performed at normal pressure, without being limited thereto, and may also be performed at high pressure. In this case, pressure may be applied through hot isostatic processing (HIP) in which pressure is applied equally in all directions of the gallium oxide powder.

As the above-described heat treatment is performed, the powder for growing a gallium oxide single crystal may have the BET-specific surface area within a predetermined range. For example, a powder for growing a gallium oxide single crystal having a BET-specific surface area of 1.5 m$^2$/g or more and 4.0 m$^2$/g or less may be obtained according to the heat treatment.

In addition, as the above-described heat treatment is performed, sizes of the gallium oxide particles may change. For example, the powder for growing a gallium oxide single crystal after the heat treatment may consist of particles with a D50 particle diameter of 20 μm or less. However, despite the heat treatment, the aspect ratio of gallium oxide particles may be maintained at 1 to 1.5.

As described above, the powder for growing a gallium oxide single crystal according to an embodiment of the present invention has a specific bulk density, and BET-specific surface area. In addition, the powder for growing a gallium oxide single crystal according to an embodiment of the present invention has characteristics of consisting of spherical gallium oxide particles with the aspect ratio of 1 to 1.5 and having a D50 particle diameter of 20 μm or less. The powder for growing a gallium oxide single crystal having the above-mentioned characteristics may have an excellent raw material-to-crystal conversion rate.

Hereinafter, the present invention will be described in detail through experimental examples.

However, the following experimental examples only illustrate the present invention, and the content of the present invention is not limited to the following inventive examples.

First, to measure a single crystal conversion rate of a powder for growing a gallium oxide single crystal according to an embodiment of the present invention, a powder for growing a gallium oxide single crystal was prepared according to the following manufacturing example.

Manufacturing Example

First, metal gallium in a solid state was heated to a temperature of 1,000° C., air was injected at a flow rate of 50 m/sec to induce oxidation, and thereafter, crystallization was induced through natural cooling to obtain a gallium oxide powder of Embodiment 1.

Meanwhile, as a control group (Comparative Example) of Embodiment 1 described above, a commercially available gallium oxide powder from Lumi-m, Co., China, was prepared.

Experimental Example 1 Comparison of Particle Characteristics Before Heat Treatment To compare particle shape characteristics of the gallium oxide powder according to Embodiment 1 and the gallium oxide powder according to the Comparative Example, each powder was photographed through a scanning electron microscope (SEM).

Figure 2:
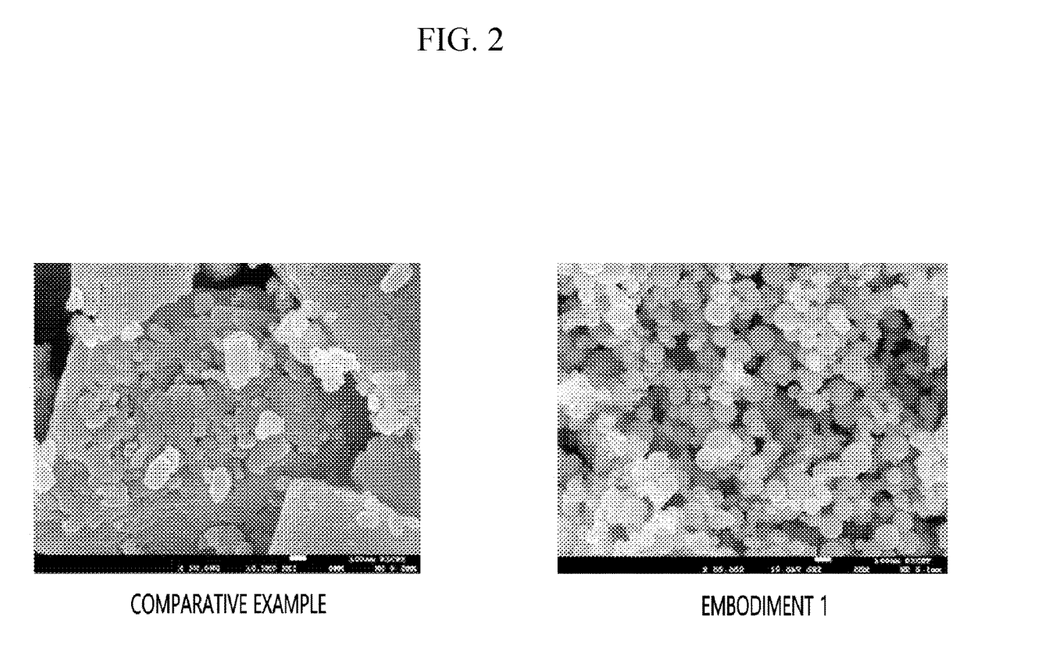
FIG. 2 are scanning electron microscope (SEM) images for comparing particle shape characteristics of powders before heat treatment in the method of manufacturing a powder for growing a gallium oxide single crystal according to an embodiment of the present invention.

FIG. 2 are scanning electron microscope (SEM) images for comparing the particle shape characteristics of powders before heat treatment in the method of manufacturing the powder for growing a gallium oxide single crystal according to an embodiment of the present invention.

Referring to Embodiment 1 of FIG. 2, it can be seen that the powder for growing a gallium oxide single crystal according to an embodiment of the present invention consists of fine spherical particles with a low aspect ratio before heat treatment, and primary particles do not agglomerate and are evenly dispersed.

Meanwhile, referring to the Comparative Example of FIG. 2, it can be seen that general gallium oxide powder consists of needle-shaped (or rod-shaped) particles with a large aspect ratio, and is present in a form of secondary particles in which primary particles are aggregated.

Specifically, an average particle diameter of the Comparative Example was measured to be 5.38 μm, and an average particle diameter of Embodiment 1 was measured to be 0.67 μm, in other words, it can be seen that the average particle diameter of Embodiment 1 is about ¹/₁₀ that of the Comparative Example. In addition, a median particle diameter of the Comparative Example was measured to be 1.81 μm, and a median particle diameter of Embodiment 1 was measured to be 0.13 μm, in other words, it can be seen that the median particle diameter of Embodiment 1 is also about ¹/₁₀ that of the Comparative Example.

This is thought to be because the powder for growing a gallium oxide single crystal according to an embodiment of the present invention was manufactured using a vaporization method, and it can be seen that it has a lower aspect ratio compared to that of general powder for growing a gallium oxide single crystal manufactured using a wet method, and particle agglomeration thereof is suppressed.

Experimental Example 2 Comparison of Particle Characteristics After Heat Treatment By heat-treating the gallium oxide powder of Embodiment 1 at the temperatures shown in Table 1 below, powders for growing a gallium oxide single crystal of Embodiments 2-2 to 2-8 were obtained. Meanwhile, the powder for growing a gallium oxide single crystal of Embodiment 2-1 refers to a powder for growing a gallium oxide single crystal without heat treatment, that is, the powder for growing a gallium oxide single crystal of Embodiment 1.

Heat treatment was performed in an alumina crucible, and it was performed by raising the crucible temperature at a rate of 5° C./min, maintaining it for a predetermined period of time after reaching the heat treatment temperature, and then allowing natural cooling. In this case, a total time from the starting point of the temperature increase to the heat treatment temperature to the end point of maintaining the temperature for the predetermined period of time was 5 hours for all Embodiments.

TABLE 1

| Classification | Heat treatment temperature | Heat treatment time |
|---|---|---|
| Embodiment 2-1 | x | x |
| Embodiment2-2 | 1,000° C. | 5 hr |
| Embodiment2-3 | 1,100° C. | 5 hr |
| Embodiment2-4 | 1,200° C. | 5 hr |
| Embodiment2-5 | 1,225° C. | 5 hr |
| Embodiment2-6 | 1,250° C. | 5 hr |
| Embodiment2-7 | 1,275° C. | 5 hr |
| Embodiment2-8 | 1,300° C. | 5 hr |

Figure 3:
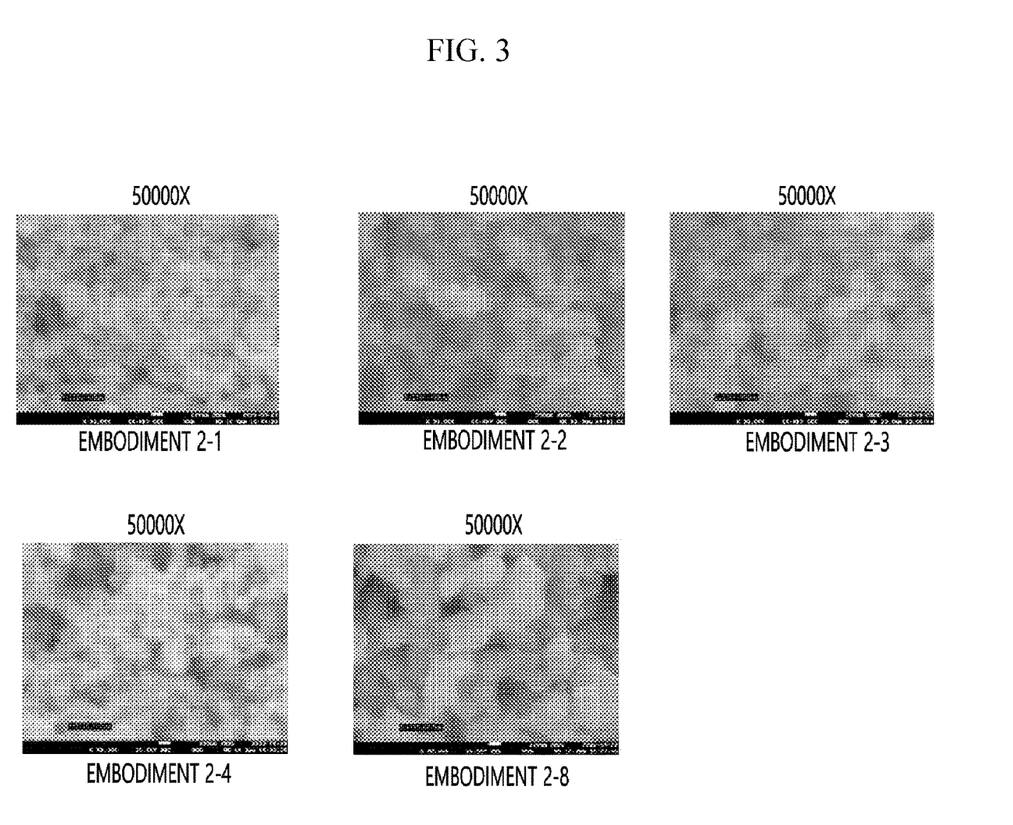
FIG. 3 are SEM images of powders for growing a gallium oxide single crystal according to embodiments in which gallium oxide powders according to Embodiment 1 of FIG. 2 were heat-treated.

FIG. 3 are SEM images of powders for growing a gallium oxide single crystal according to embodiments in which gallium oxide powders according to Embodiment 1 of FIG. 2 were heat-treated.

Specifically, FIG. 3 are SEM images of powders for growing a gallium oxide single crystal of Embodiment 2-1, Embodiment 2-2, Embodiment 2-3, Embodiment 2-4 and Embodiment 2-8.

As can be seen with reference to FIG. 3, it can be seen that most powders for growing a gallium oxide single crystal according to an embodiment of the present invention maintain low aspect ratio characteristics compared to the gallium oxide powder before heat treatment (Embodiment 2-1), and aggregation is significantly suppressed even after heat treatment.

In particular, referring to Embodiments 2-2 to 2-8, it can be seen that the particle characteristics before heat treatment are well maintained despite the heat treatment. Meanwhile, it can be seen that the size of the particles increases as the heat treatment temperature increases, which is thought to be caused by crystal growth in some particles due to heat.

Meanwhile, for Embodiments 2-1 to 2-8, particle sizes of the particles were measured using particle size analyzer (PSA) Mastersizer 2000 equipment from Malvern. The results are shown in [Table 2] below.

TABLE 2

| Classification | Heat treatment temperature | Heat treatment time | D10 | D50 | D90 |
|---|---|---|---|---|---|
| Embodiment 2-1 | Heat treatment x | x | 0.075 | 0.138 | 0.441 |
| Embodiment2-2 | 1,000° C. | 5 hr | 0.508 | 1.914 | 10.799 |
| Embodiment2-3 | 1,100° C. | 5 hr | 0.677 | 4.159 | 19.072 |
| Embodiment2-4 | 1,200° C. | 5 hr | 0.912 | 11.825 | 31.969 |
| Embodiment2-5 | 1,225° C. | 5 hr | 0.978 | 12.535 | 36.718 |
| Embodiment2-6 | 1,250° C. | 5 hr | 1.043 | 15.229 | 42.050 |
| Embodiment2-7 | 1,275° C. | 5 hr | 1.096 | 17.643 | 45.629 |
| Embodiment2-8 | 1,300° C. | 5 hr | 1.131 | 19.547 | 47.430 |

As can be seen with reference to the above [Table 2], as the heat treatment temperature increases, it can be seen that diameters of the particles generally increase.

Meanwhile, as can be seen with reference to Embodiments 2-4 to 2-7, it can be seen that when heat treatment is performed at a temperature of 1,200° C. to 1,300° C., the D50 particle diameter is 11.875 μm to 19.547 μm, and even after heat treatment, the D50 particle diameter is maintained within 20 μm.

Experimental Example 3 Measurement of Raw Material-to-Crystal Conversion Rate

The powder for growing a gallium oxide single crystal according to an embodiment of the present invention has a specific range of bulk density or BET-specific surface area, and the powder for growing a gallium oxide single crystal having the above-mentioned characteristics has an excellent raw material-to-crystal conversion rate.

To analyze a relationship between bulk density or BET-specific surface area characteristics and the raw material-to-crystal conversion rate of the powder for growing a gallium oxide single crystal according to an embodiment of the present invention, first, the bulk density and BET specific surface area of the powders of Embodiments 2-1 to 2-8 were measured.

The bulk density was calculated by filling the powder according to the Embodiments such that the crucible is full and then dividing the filling weight of the powder by an internal volume of the crucible.

In addition, the BET-specific surface area was measured according to ASTM D 3663, using Tristar II equipment from Micrometrics.

Meanwhile, to measure the raw material-to-crystal conversion rates of Embodiments 2-1 to 2-8, gallium oxide single crystals were grown using the powders of Embodiments 2-1 to 2-8.

The powder for growing a gallium oxide single crystal according to an embodiment of the present invention may be processed into a single crystal ingot (or substrate) through various growth methods. For example, various methods such as the Czochralski method, floating zone method, Bridgman method, vertical Bridgman method (VB), Edge-defined Film-fed Growth (EFG), and the like may be used.

In this specification, as an example, a method of manufacturing a gallium oxide single crystal by the EFG method will be exemplarily described with reference to FIG. 4. However, the powder for growing a gallium oxide single crystal according to an embodiment of the present invention is not only applicable to the EFG method, but also may be processed into a single crystal ingot through the various single crystal growth methods described above.

Figure 4:
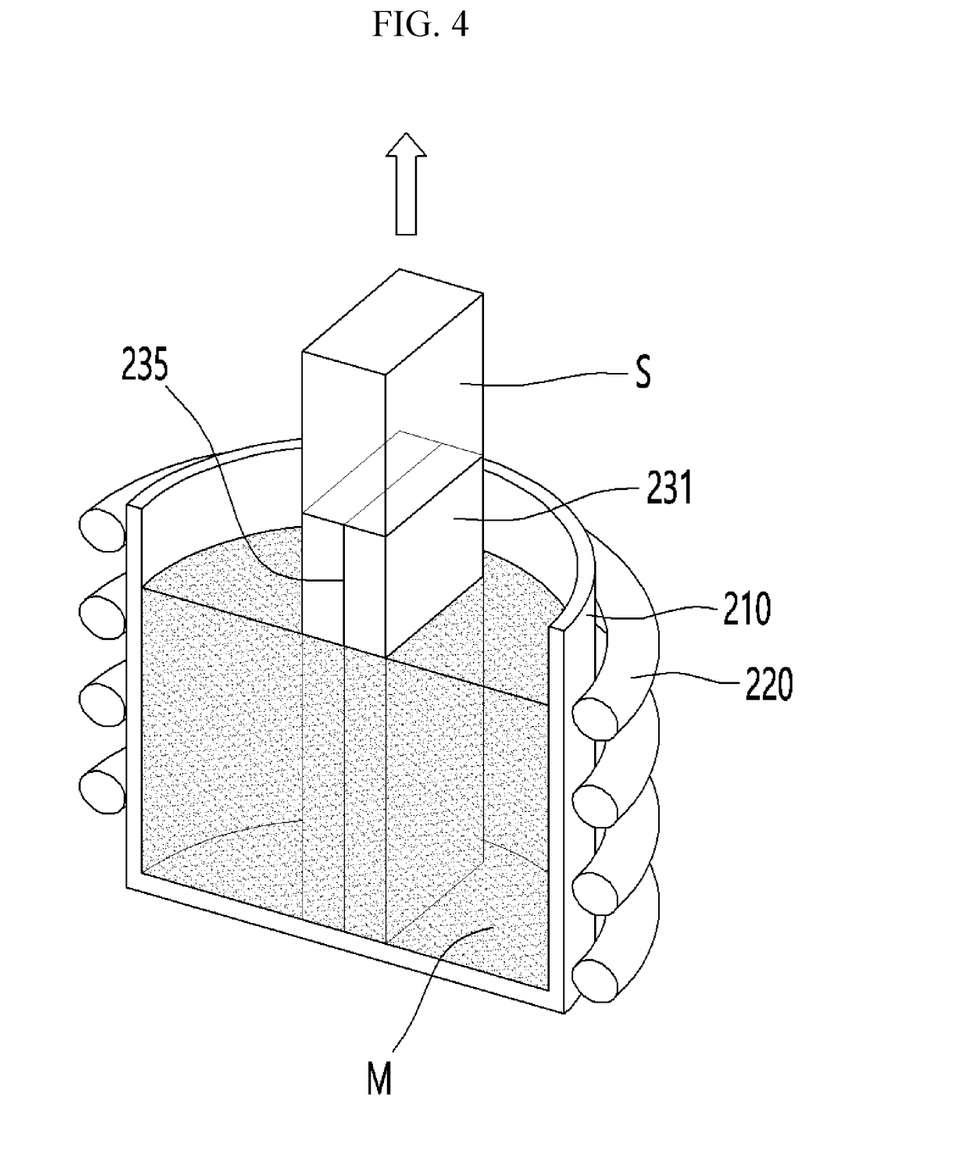
FIG. 4 is a conceptual diagram illustrating a method of growing a gallium oxide single crystal using a powder for growing a gallium oxide single crystal according to an embodiment of the present invention.

FIG. 4 is a conceptual diagram illustrating a method of growing a gallium oxide single crystal using the powder for growing a gallium oxide single crystal according to an embodiment of the present invention.

Referring to FIG. 4, EFG equipment includes a crucible 210 providing a space for melting a powder for growing a gallium oxide single crystal, a heater 220 surrounding the crucible 210, a mold 231 disposed in a center of the crucible 210 and a slit 235 communicating with an inner space of the crucible 210, as an inner space of the mold 231.

The crucible 210 may consist of a highly heat-resistant material that has excellent thermal conductivity and does not deform or melt even at the melting point of gallium oxide, and for example, it may consist of iridium.

The heater 220 is a member capable of heating the crucible 210, and for example, it may consist of a coil that generates heat in the crucible 210 through an induced electromotive force. However, the present invention is not limited thereto, and the heater 220 may be configured to directly generate heat in a resistance manner.

The mold 231 constitutes an outer wall of the slit 235 and may be formed to have an appropriate thickness to prevent a molten gallium oxide solution M raised through the slit 235 from leaking or evaporating. The mold 231 may consist of the same material as the crucible 210.

The slit 235 raises the molten gallium oxide solution M to induce growth into a single crystal, and a cross-sectional shape of the slit 235 may correspond to a cross-sectional shape of a gallium oxide single crystal ingot S to be ultimately formed.

The powder for growing a gallium oxide single crystal is filled into the inner space of the crucible 210, and when the crucible 210 is heated by the heater 220, the powder may be melted to form the molten gallium oxide solution M.

In this experimental example, 150 g of each powder for growing a gallium oxide single crystal of Embodiments 2-1 to 2-8 was melted at a temperature of 1,800° C. or higher, using an iridium crucible.

The molten gallium oxide solution M may be raised to the slit 235 communicating with the internal space of the crucible 210 by a capillary force. The molten gallium oxide solution M raised to an upper end of the slit 235 by a capillary force comes into contact with a seed crystal that initiates the growth of a single crystal, and may grow along an upward direction of the seed crystal to form the gallium oxide single crystal ingot S.

In this experimental example, the gallium oxide single crystal was grown in a b-axis direction using a β-$Ga_2O_3$ seed crystal.

In addition, the raw material-to-crystal conversion rates were measured for Embodiments 2-1 to 2-8. The single crystal conversion rates were calculated using Equation 1 below.

$$\frac{\text{Weight of grown single crystal (g)}}{\text{Weight of filled raw material (g)}} \times 100 \quad \text{[Equation 1]}$$

Experimental results for Embodiments 2-1 to 2-8 are shown in Table 3 below.

TABLE 3

| Classification | Heat treatment Temperature | Bulk density (g/cm$^3$) | BET-specific (m$^2$/g) | Filled amount of (g) | Weight of grown (g) | Raw material-crystal conversion rate |
|---|---|---|---|---|---|---|
| Embodiment 2-1 |  | 0.40 | 11.9796 | 150 | 118.8 | 79.2 |
| Embodiment2-2 | 1,000 | 0.50 | 7.9009 | 150 | 121.7 | 81.2 |
| Embodiment2-3 | 1,100 | 0.60 | 6.5792 | 150 | 126.2 | 84.1 |
| Embodiment2-4 | 1,200 | 0.70 | 2.9939 | 150 | 130.6 | 87.1 |
| Embodiment2-5 | 1,225 | 0.80 | 3.8115 | 150 | 135.0 | 90.0 |
| Embodiment2-6 | 1,250 | 0.90 | 2.6943 | 150 | 139.4 | 93.0 |
| Embodiment2-7 | 1,275 | 1.00 | 1.5908 | 150 | 144.0 | 96.0 |
| Embodiment2-8 | 1,300 | 1.11 | 0.8997 | 150 | 127.1 | 84.7 |

Referring to [Table 3], the powders for growing a gallium oxide single crystal of Embodiments 2-4 to 2-7 have a bulk density of 0.7 to 1.0 g/cm$^3$ and a BET-specific surface area of 1.5 to 4.0 m$^2$/g.

It can be seen that the powders for growing a gallium oxide single crystal of Embodiments 2-4 to 2-7 have an excellent raw material-to-crystal conversion rate compared to the powders for growing a gallium oxide single crystal of Embodiments 2-1 to 2-3 and Embodiment 2-8. That is, it can be seen that 87% or more of 150 g of the raw material powder filled into the crucible was grown into gallium oxide single crystals. In particular, it can be seen that the raw material-to-crystal conversion rate was improved 15% or more compared to the powder for growing a gallium oxide single crystal of Embodiment 2-1 without heat treatment.

The inventors of the present invention found that when a powder for growing a gallium oxide single crystal has a specific bulk density or a specific BET-specific surface area, a filling rate of the powder may be maximized and at the same time, the raw material-to-crystal conversion rate may be maximized.

That is, when the bulk density of a powder for growing a gallium oxide single crystal is 0.7 to 1.0 g/cm$^3$, and the BET-specific surface area is 1.5 to 4.0 m$^2$/g, a large amount of powder may be filled in the crucible and at the same time, the raw material-to-crystal conversion rate may be maximized.

When the bulk density is less than 0.7 g/cm$^3$, the crucible may not be filled with a sufficiently large amount of powder for growing a gallium oxide single crystal, which may result in a decrease in the raw material-to-crystal conversion rate.

In addition, when the bulk density exceeds 1.0 g/cm$^3$, the crucible may be filled with a sufficiently large amount of powder for growing a gallium oxide single crystal, but the BET-specific surface area is too low, and the powder for growing a gallium oxide single crystal may not be sufficiently melted. As a result, melt uniformity may be reduced, and gallium oxide crystallization may be hindered. Accordingly, the raw material-to-crystal conversion rate may decrease.

Meanwhile, since the powder for growing a gallium oxide single crystal according to an embodiment of the present invention has characteristics of an aspect ratio of 1 to 1.5, and a D50 of 20 μm or less, it is possible to satisfy the above-mentioned ranges of bulk density and BET-specific surface area, and due to this, it is possible to have an excellent raw material-to-crystal conversion rate.

The above-mentioned description of the present invention is for illustrative purposes, and it will be understood that those skilled in the art to which the present invention pertains can modify the present invention into other specific forms without changing its technical idea or essential features. Therefore, the embodiments described above should be understood to be illustrative in all respects and not restrictive. For example, each component described as a single type may be implemented in a distributed manner, and similarly, components described as distributed may also be implemented in a combined form.

According to any one of the above-described means for solving the problems of the present invention, there can be provided a powder for growing a gallium oxide single crystal and a manufacturing method thereof, which can fill a sufficient amount of powder for growing a gallium oxide single crystal into a limited crucible and implement an excellent raw material-to-crystal conversion rate.

In addition, according to any one of the means for solving the problem of the present invention, the raw material-to-crystal conversion rate can be maximized to raise the use efficiency of the powder for growing a gallium oxide single crystal, thereby reducing the manufacturing costs of gallium oxide single crystals.

The effects that may be obtained from the present invention are not limited to the effects mentioned above, and other effects not mentioned will be clearly understood by those skilled in the art from the description below.

It should be interpreted that the scope of the present invention is indicated by the claims described below rather than the above detailed description, and the meaning and scope of the appended claims and all changes or modified forms derived from the equivalent concepts thereof are included in the scope of the present invention.

What is claimed is:

1. A powder for growing a gallium oxide single crystal, made of gallium oxide, wherein the powder has a bulk density of 0.9 g/cm$^3$ or more and 1.0 g/cm$^3$ or less, and has a BET-specific surface area of 1.5 m$^2$/g or more and 2.6943 m$^2$/g or less.

2. The powder of claim 1, wherein the powder for growing a gallium oxide single crystal is made of gallium oxide particles with a D50 particle diameter of 20 μm or less.

3. The powder of claim 2, wherein an aspect ratio of the gallium oxide particles is 1 to 1.5.

4. The powder of claim 2, wherein the gallium oxide particle has beta (β) phase gallium oxide.

5. A method of manufacturing a powder for growing a gallium oxide single crystal, comprising:
    a vaporization step of heating and vaporizing gallium, to obtain vaporized gallium;
    an oxidation step of oxidizing the vaporized gallium, to obtain an oxidized gallium oxide;
    a crystallization step of cooling and crystallizing the oxidized gallium oxide, to obtain a crystallized gallium oxide;
    a collection step of collecting the crystallized gallium oxide to obtain a gallium oxide powder; and
    a densification step of making a bulk density of the gallium oxide powder be 0.9 g/cm$^3$ or more and 1.0 g/cm$^3$ or less, and making a BET-specific surface area of the gallium oxide powder be 1.5 m$^2$/g or more and 2.6943 m$^2$/g or less.

6. The method of claim 5, wherein the densification step includes a heat treatment step of heat-treating the gallium oxide powder at a temperature of 1,200° C. to 1,300° C.

7. The method of claim 6, wherein the heat treatment step is performed for 5 hours or more.

8. The method of claim 5, wherein the powder for growing a gallium oxide single crystal is made of gallium oxide particles with a D50 particle diameter of 20 μm or less.

* * * * *